US010644458B2

(12) United States Patent
Oh et al.

(10) Patent No.: US 10,644,458 B2
(45) Date of Patent: May 5, 2020

(54) SHIELDED INTERCONNECT ARRAY

(71) Applicant: Intel Corporation, Santa Clara, CA (US)

(72) Inventors: Youngseok Oh, Portland, OR (US); Justin M Huttula, Hillsboro, OR (US); Mohanraj Prabhugoud, Hillsboro, OR (US); Ronald Kirby, Portland, OR (US); Joe Walczyk, Tigard, OR (US); Erkan Acar, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 301 days.

(21) Appl. No.: 15/476,582

(22) Filed: Mar. 31, 2017

(65) Prior Publication Data

US 2018/0287305 A1    Oct. 4, 2018

(51) Int. Cl.
*B23P 19/00* (2006.01)
*H01R 13/6594* (2011.01)
*G01R 1/04* (2006.01)
*G01R 1/067* (2006.01)
*H01R 12/71* (2011.01)
*H01R 13/24* (2006.01)

(52) U.S. Cl.
CPC ......... *H01R 13/6594* (2013.01); *G01R 1/045* (2013.01); *G01R 1/06722* (2013.01); *H01R 12/714* (2013.01); *H01R 13/2435* (2013.01); *H01R 2201/20* (2013.01); *Y10T 29/5313* (2015.01)

(58) Field of Classification Search
CPC ............................... H01R 13/6471; H01R 12/716; H01R 13/187; H01R 13/6587; H01R 13/6598; H01R 13/6582; H01R 13/6593; H01R 12/775; H01R 13/6583; H01L 2924/3025; Y10S 439/941; Y10T 29/4913; Y10T 29/49208; Y10T 29/5313
USPC ......... 29/729, 739, 745, 747, 827, 832, 835, 29/842, 854, 874, 881
See application file for complete search history.

(56) References Cited

U.S. PATENT DOCUMENTS 5,775,947 A  *  7/1998  Suzuki ............... H01R 13/6471
439/108

\* cited by examiner

*Primary Examiner* — Thiem D Phan
(74) *Attorney, Agent, or Firm* — Schwegman Lundberg & Woessner, P.A.

(57) ABSTRACT

A shielded interconnect array and associated methods are described. Examples of the shielded interconnect array include socket connections that include conductive members with flexible bends. In examples shown, corresponding grounded conductive members with flexible bends are located adjacent to other conductive members with flexible bends to provide shielding.

10 Claims, 4 Drawing Sheets

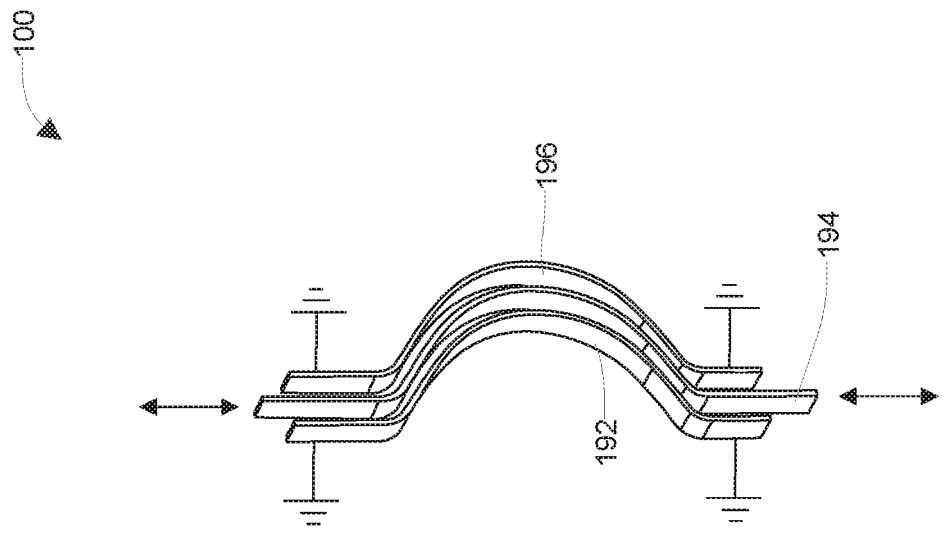
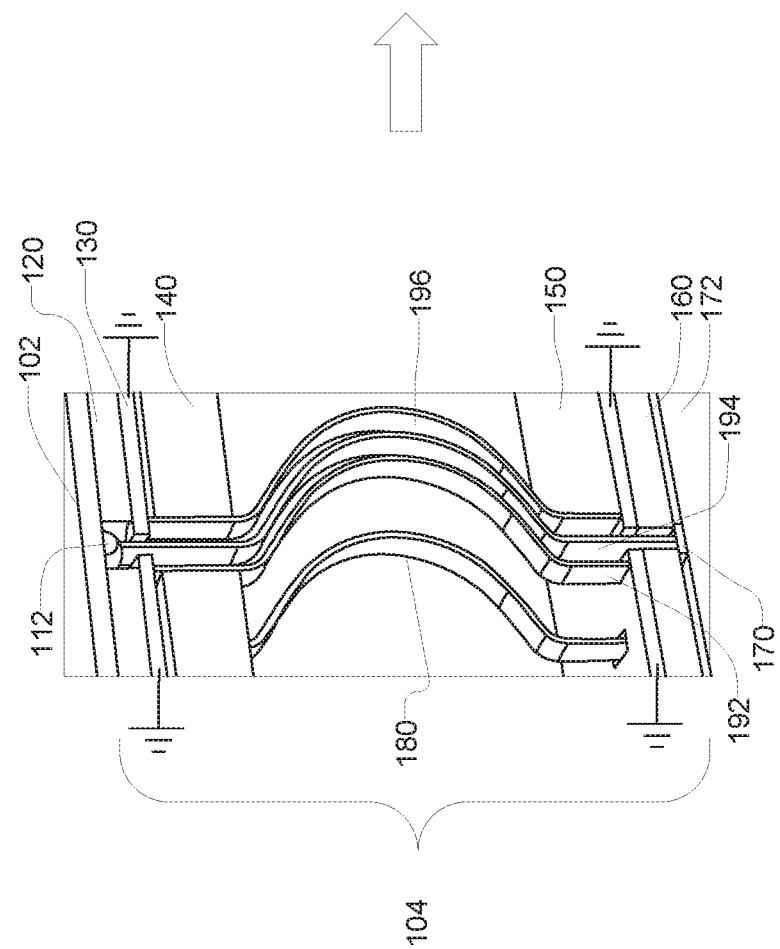

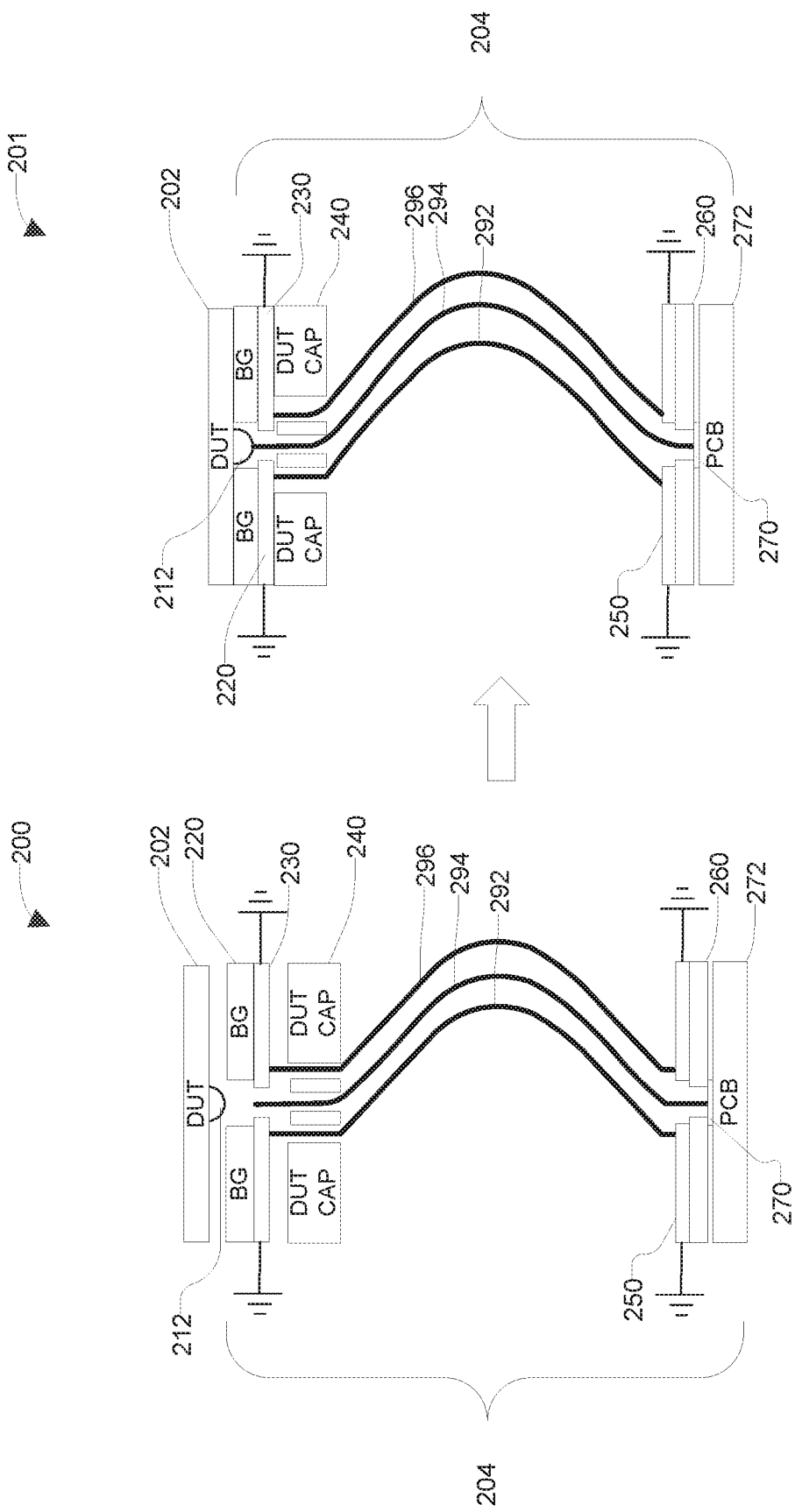

SHIELDED INTERCONNECT ARRAY

BACKGROUND

Future roadmaps for high end client and server products suggest socket technology may need bandwidth beyond 20 GHz and scalable link interface (SLI) pitch scaling down to 0.3 mm. In addition for sockets, such as test socket interconnect arrays, traditional spring based pogo-pin technology is costly, and is expected to continue to rise as pitch decreases and performance increases. A solution is needed to meet the future performance and cost requirements.

BRIEF DESCRIPTION OF THE DRAWINGS

FIG. 1A shows an example of a portion of an interconnect socket according to some embodiments of the disclosure.

FIG. 1B shows an example of a connection according to some embodiments of the disclosure.

FIG. 2A shows a side view of an example connection according to some embodiments of the disclosure.

FIG. 2B shows another side view of an example connection according to some embodiments of the disclosure.

DESCRIPTION OF EMBODIMENTS

Figure 3:
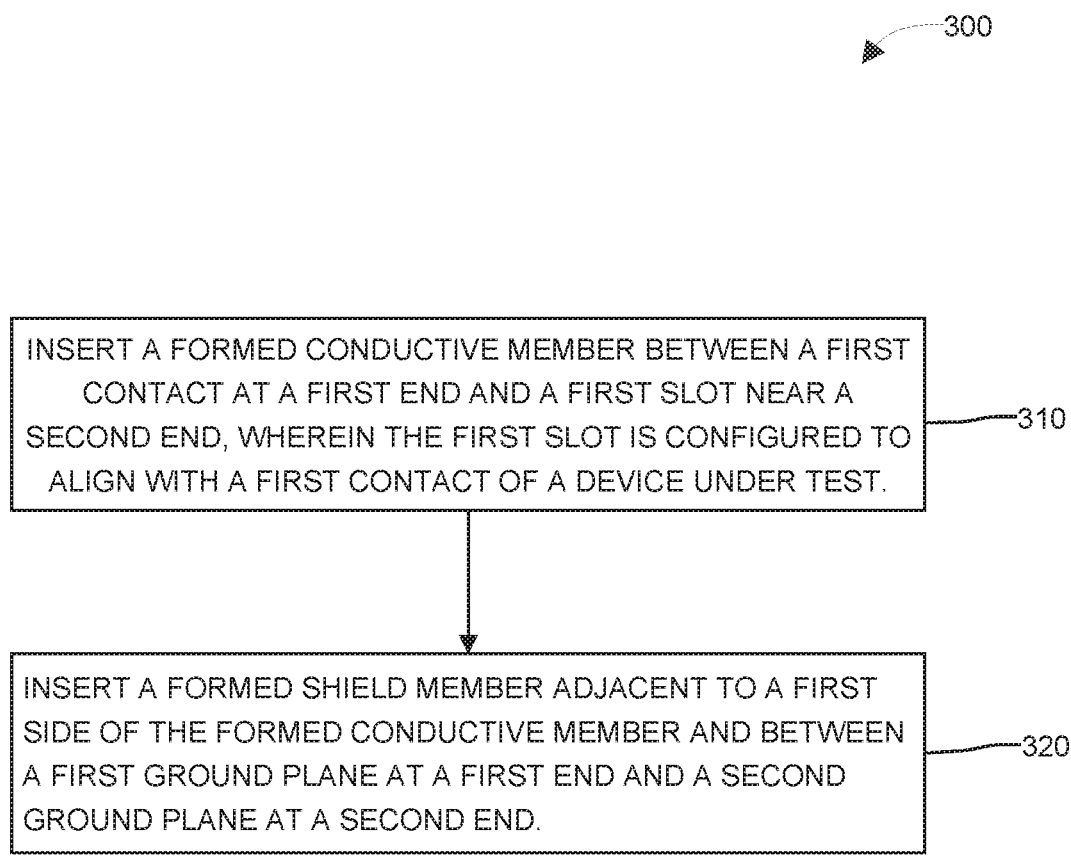
FIG. 3 shows a flow chart for a method according to some embodiments of the disclosure.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Although the present disclosure uses elements of semiconductor chip devices, and their method of manufacture as an example, the disclosure is not so limited. Examples of the present disclosure may be used in any technology where formation of a solder ball in a solder resist layer is controlled.

FIG. 1A shows an example of a portion of an interconnect socket 100 that includes a connection 104 with a formed conductive member conductive plate 150 according to some embodiments of the disclosure. The connection 104 may be included in an array of connections in a socket 100. The connection 104 may connect with a device under test (DUT) 102 to test the DUT 102 by passing signals through the formed conductive member conductive plate 150. The DUT may include a contact 112 for sending and receiving signals. Although a device under test (in use with a test fixture) is used as an example, other examples include a socket for other interconnection uses apart from product testing. While FIG. 1A only shows three exemplary formed conductors, it is understood that the connection 104 may include an array of more than three formed conductors.

The connection 104 may include a top portion that has a ball guide 120, a conductive layer 130, a cap/stiffener layer 140 to connect to the DUT 102. The ball guide 120 may provide a slot to guide the 112 of the DUT 102 to contact a conductive core 152 of the formed conductive member conductive plate 150. The conductive layer 130 may electrically connect to a common DUT ground. The active cap layer 132 may electrically connect the dielectric material 154 to the common DUT ground near a first end. In one example, the cap/stiffener layer 140 is a base layer that provides a support for the upper layers.

The connection 104 may further include a bottom portion that has a conductive plate 150, a printed circuit board (PCB) cap 160, a contact 170, and a PCB 172. Although a printed circuit board is used as an example circuit to connect to, the invention is not so limited. Examples of sockets described in the present disclosure may be used to connect any two circuit types or board types, or combinations thereof together.

The conductive plate 150 may serve as a ground plane for the lower portion. The PCB cap 160 may provide server as a cap for the PCB 172. The PCB 172 may provide an interface to a tester (not shown). The contact 170 may provide a contact to the PCB 172 for signaling along conductors (e.g., the formed conductive member 194).

Extending between the top portion and the bottom portion of is a series of conductors. A formed conductive member 180 may be implemented as a standalone conductor to transmit signals that are less susceptible to interference. For example, the formed conductive member 180 may be used to provide power and ground channels. The material of the formed conductive member 180 may provide electrical interconnecting function and the shape of the formed conductive member 180 may provide mechanical compliance with contact force. In one example, the shape and material choice of the formed conductive member 180 provides a spring force that applies pressure to other electrical contacts and forms an electrical connection. In the example, shown, a "C" shape is formed, however, the invention is not so limited.

A formed conductive member 194, shielded by a formed shield member 192 and a formed shield member 196, may be implemented as a shielded conductor to transmit signals that are more susceptible to interference. For example the formed conductive member 194 may be implemented to transmit data signals and input/output (I/O) probes. The material of the formed conductive member 194 may provide electrical interconnecting function and the shape of the formed conductive member 194 may provide mechanical compliance with contact force. The formed shield member 192 and the formed shield member 196 may provide electromagnetic shielding for the formed conductive member 194 to prevent electrical crosstalk between adjacent conductors. The formed shield member 192 and the formed shield member 196 may each have shape that is similar to a shape of the formed conductive member 194 such that a gap (e.g., distance) between the formed conductive member 194 and each of the formed shield member 192 and the formed shield member 196 remains consistent (e.g., the formed shield member 192, the formed conductive member 194, and the formed shield member 196 follow parallel paths). Each end of both of the formed shield member 192 and the formed shield member 196 may be coupled to a ground plane via the conductive plate 150.

FIG. 1B depicts a schematic representation of properties of the formed shield member 192, the formed conductive member 194, and the formed shield member 196 within the connection 104 according to some embodiments of the disclosure. The formed shield member 192 and the formed shield member 196 are coupled to ground at each end, and the formed conductive member 194 has a resilient mechanical property that provides contact force when compressed. The air gap between the formed shield member 192 and the formed conductive member 194 and between the formed conductive member 194 and the formed shield member 196 may provide the shielding effect, as the air may act as a dielectric layer. In some examples, the electrical performance of the formed conductive member 194 may be altered by changing a distance between the formed conductive member 194 and each of the formed shield member 192 and the formed shield member 196.

In some examples, the material and shape of the formed conductive member 180 and the formed conductive member 194 may be identical. In some examples, one or more of the formed conductive member 180, the formed shield member 192, the formed conductive member 194, and the formed shield member 196 may have a rectangular cross section. In other examples, one or more of the formed conductive member 180, the formed shield member 192, the formed conductive member 194, and the formed shield member 196 may have a different shape cross section, such as square, circular, ovular, cylindrical, H-shaped, semi-circular, etc. While FIGS. 1A and 1B depict the formed conductive member 180, the formed shield member 192, the formed conductive member 194, and the formed shield member 196 with S-shaped bends, the formed conductive member 180, the formed shield member 192, the formed conductive member 194, and the formed shield member 196 may be implemented with other bend shapes, such as a J-shaped bend or a C-shaped bend.

FIG. 2A illustrates a block diagram of a portion of a socket interconnect array system 200 in an uncompressed state, according to some embodiments of the disclosure. FIG. 2B illustrates a block diagram of portion of a socket interconnect array system 201 in a compressed state, according to some embodiments of the disclosure. FIGS. 2A and 2B include a connection 204 configured to be coupled to a DUT 202. In some examples, the connection 104 of FIG. 1 may implement the connection 204.

Referring now to FIGS. 2A and 2B, the connection 204 may include a top portion that has a ball guide 220, a conductive layer 230, a cap/stiffener layer 240 to connect to the DUT 202. The ball guide 220 may provide a slot to guide the 212 of the DUT 202 to contact a conductive core 252 of the formed conductive member conductive plate 250. The 230 may electrically connect to a common DUT ground. The active cap layer 232 may electrically connect the dielectric material 254 to the common DUT ground near a first end. The cap/stiffener layer 240 is a base layer that provides a support for the upper layers.

The connection 204 may further include a bottom portion that has a conductive plate 250, a PCB cap 260, a contact 270, and a PCB 272. The conductive plate 250 may serve as a ground plane for the lower portion. The PCB cap 260 may provide server as a cap for the PCB 272. The PCB 272 may provide an interface to a tester (not shown). The contact 270 may provide a contact to the PCB 272 for signaling along conductors (e.g., the formed conductive member 294).

The formed shield member 292, the formed conductive member 294, and the formed shield member 296 may act as an interconnect that extends between the top portion and the bottom portion of the connection 204. The formed conductive member 294, shielded by a formed shield member 292 and a formed shield member 296, may be implemented as a shielded conductor to transmit signals that are more susceptible to interference. For example the formed conductive member 294 may be implemented to transmit data signals and input/output (I/O) probes. The material of the formed conductive member 294 may provide electrical interconnecting function and the shape of the formed conductive member 294 may provide mechanical compliance with contact force (e.g., via an S-shaped bend). That is, as the DUT 202 is installed on the connection 204, the connection system 200 in the uncompressed state transitions to the connection system 201 in the compressed state. As this happens, the formed conductive member 294 may compress at the bend in the formed conductive member 194 in a spring-like fashion, such that the formed conductive member 294 exerts pressure between the contact 270 and the contact of the DUT 202. The formed shield member 292 and the formed shield member 296 may provide electromagnetic shielding for the formed conductive member 294 to prevent electrical crosstalk between adjacent conductors. Each end of both of the formed shield member 192 and the formed shield member 196 may be coupled to a ground plane via the conductive plate 250.

In some examples, one or more of the formed shield member 292, the formed conductive member 294, and the formed shield member 296 may have a rectangular cross section. In other examples, one or more of the formed shield member 292, the formed conductive member 294, and the formed shield member 296 may have a different shape cross section, such as round, ovular, semi-circular, etc. While FIGS. 2A and 2B depict the formed shield member 292, the formed conductive member 294, and the formed shield member 296 with S-shaped bends, the formed shield member 292, the formed conductive member 294, and the formed shield member 296 may be implemented with other bend shapes, such as a J-shaped bend or a C-shaped bend.

FIG. 3 illustrates a method 300 to form a connection according to some embodiments of the disclosure. The method 300 may be implemented the connection 104 of FIG. 1A, the connection 204 of FIGS. 2A and 2B, or combinations thereof.

The method 300 may include inserting a formed conductive member between a first contact at a first end and a first slot near a second end, at 310. The first slot is configured to align with a first contact of a device under test (e.g., the DUT 102 of FIG. 1A or the DUT 202 of FIGS. 2A and 2B). The first formed conductive member may include the formed conductive member 194 of FIGS. 1A and 1B and/or the formed conductive member 294 of FIGS. 2A and 2B. The first formed conductive member may have an S-shaped bend. The first contact may include the contact 170 of FIG. 1 and/or the contact 270 of FIGS. 2A and 2B. The method 300 may further include compressing the formed conductive member and the formed shield member to install the device under test. In some examples, the formed conductive member may have one of a square, ovular, or H-shaped cross section.

The method 300 may include inserting a formed shield member adjacent to a first side of the formed conductive member and between a first ground plane at a first end and a second ground plane at a second end, at 320. The formed shield member may include one of the formed shield member 192 or the formed shield member 196 of FIG. 1 and/or one of the formed shield member 292 or the formed shield member 296 of FIGS. 2A and 2B. The formed shield member may include an S-shaped bend. The formed shield member may protect the first side of the formed conductive member from electromagnetic waves. The method 300 may further include maintaining a constant horizontal gap between the formed shield member and the first side of the formed conductive member.

The method 300 may further include inserting a second formed shield member adjacent to a second side of the formed conductive member and between the first ground plane at a first end and the second ground plane at a second end. The second formed shield member may have an S-shaped bend. The second formed shield member may include the other one of the formed shield member 192 or the formed shield member 196 of FIG. 1 and/or the other one of one of the formed shield member 292 or the formed shield member 296 of FIGS. 2A and 2B. In some examples, a horizontal gap extending between the first formed shield member and the formed conductive member is equal to a horizontal gap extending between the second formed shield member and the formed conductive member. In one example, the horizontal gaps stay substantially the same in both a compressed state (FIG. 2B) and an uncompressed stated (FIG. 2A).

The method 300 may include inserting a second formed conductive member between a second contact at a first end and a second slot near a second end. The second slot is configured to align with a second contact of the device under test. The second formed conductive member may include the formed conductive member 180 of FIG. 1A. The second formed conductive member may have an S-shaped bend.

The method 300 may further include forming a ball guide layer having slots that guide contacts of the device under test into place during installation. The ball guide layer may include the ball guide 120 of FIG. 1A or the ball guide 220 of FIGS. 2A and 2B. The method 300 may further include forming a conductive plate coupled to a ground node to form the first ground plane. The conductive plate may include the conductive plate 130 of FIG. 1A or the conductive plate 230 of FIGS. 2A and 2B. The formed shield member may contact the conductive plate. The method 300 may further include forming a stiffener layer configured to provide structural support for the ball guide layer and the conductive plate. The stiffener layer may include the cap/stiffener layer 140 of FIG. 1A or the cap/stiffener layer 240 of FIGS. 2A and 2B.

The method 300 may further include forming a conductive plate coupled to a ground node to form the second ground plane. The conductive plate may include the conductive plate 150 of FIG. 1A or the conductive plate 250 of FIGS. 2A and 2B. The formed shield member may contact the conductive plate. The method 300 may further include forming a printed circuit board to provide an interface between a tester and the formed conductive member for testing the device under test. The printed circuit board may include the PCB 172 of FIG. 1A or the PCB 272 of FIGS. 2A and 2B. The method 300 may further include forming a contact to contact the formed conductive member and the printed circuit board. The contact may include the contact 170 of FIG. 1A or the contact 270 of FIGS. 2A and 2B. The method 300 may further include forming a printed circuit board cap extending between the conductive plate and the printed circuit board to protect the printed circuit board. The printed circuit board cap may include the PCB cap 160 of FIG. 1A or the PCB cap 260 of FIGS. 2A and 2B.

Figure 4:
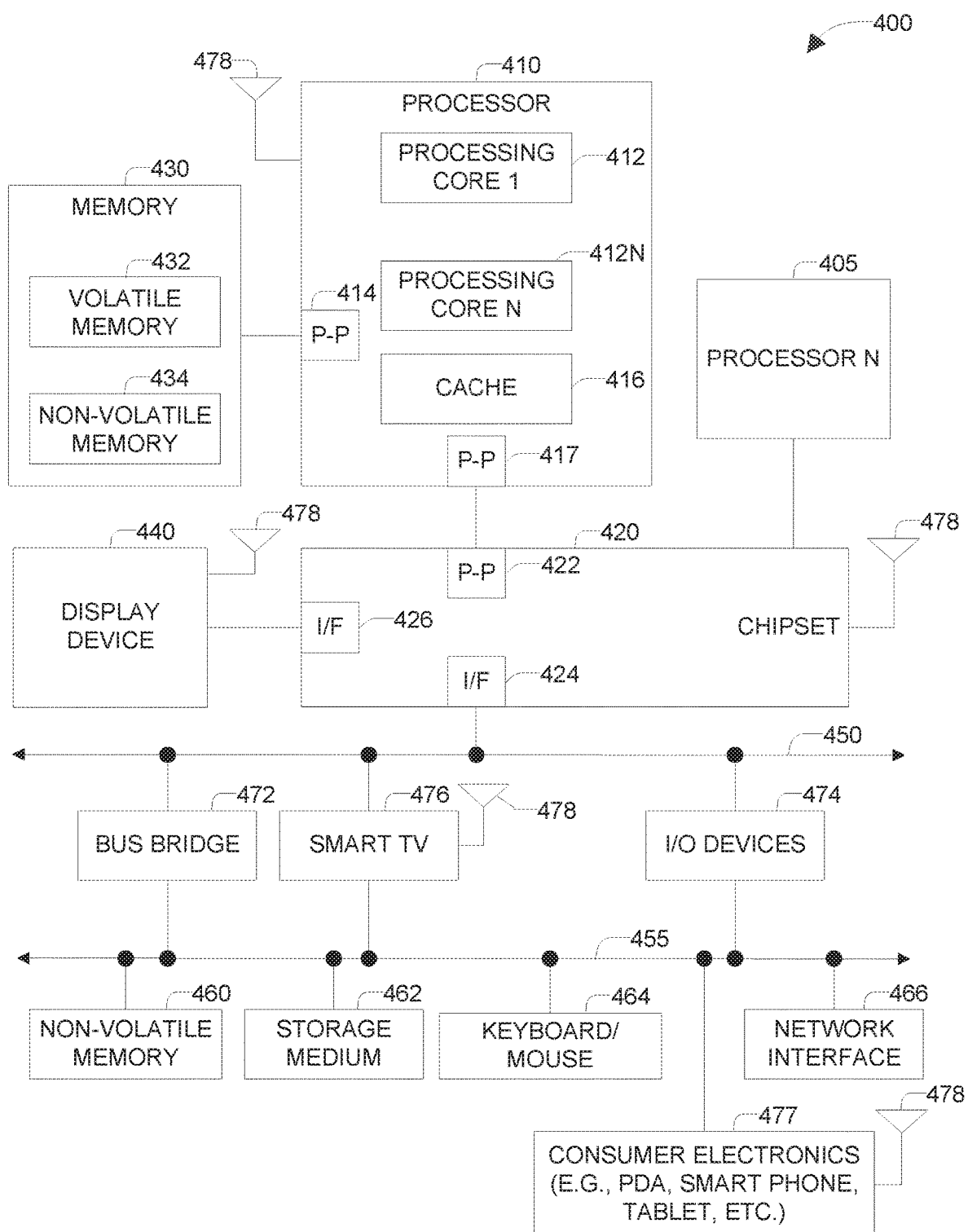
FIG. 4 illustrates a system level diagram, according to some embodiments of the disclosure.

FIG. 4 illustrates a system level diagram, according to one embodiment of the invention. For instance. FIG. 4 depicts an example of an electronic device (e.g., system 400) that may include a socket and connections as described in the present disclosure, such as the connection 104 of FIG. 1, the connection 204 of FIG. 2, the connection 304 of FIG. 3, the connection 404 of FIG. 4, or combinations thereof. In one example, one or more components of system 400 may be tested (as a DUT) using examples of the present invention.

FIG. 4 is included to show an example of a higher level device application for the present invention. In one embodiment, system 400 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 400 is a system on a chip (SOC) system.

In one embodiment, processor 410 has one or more processing cores 412 and 412N, where 412N represents the Nth processor core inside processor 410 where N is a positive integer. In one embodiment, system 400 includes multiple processors including 410 and 405, where processor 405 has logic similar or identical to the logic of processor 410. In some embodiments, processing core 412 includes, but is not limited to, pre-fetch logic to fetch instructions, decode logic to decode the instructions, execution logic to execute instructions and the like. In some embodiments, processor 410 has a cache memory 416 to cache instructions and/or data for system 400. Cache memory 416 may be organized into a hierarchal structure including one or more levels of cache memory.

In some embodiments, processor 410 includes a memory controller 414, which is operable to perform functions that enable the processor 410 to access and communicate with memory 430 that includes a volatile memory 432 and/or a non-volatile memory 434. In some embodiments, processor 410 is coupled with memory 430 and chipset 420. Processor 410 may also be coupled to a wireless antenna 478 to communicate with any device configured to transmit and/or receive wireless signals. In one embodiment, the wireless antenna interface 478 operates in accordance with, but is not limited to, the IEEE 802.11 standard and its related family. Home Plug AV (HPAV), Ultra Wide Band (UWB), Bluetooth, WiMax, or any form of wireless communication protocol.

In some embodiments, volatile memory 432 includes, but is not limited to. Synchronous Dynamic Random Access Memory (SDRAM), Dynamic Random Access Memory (DRAM), RAMBUS Dynamic Random Access Memory (RDRAM), and/or any other type of random access memory device. Non-volatile memory 434 includes, but is not limited to, flash memory, phase change memory (PCM), read-only memory (ROM), electrically erasable programmable read-only memory (EEPROM), or any other type of non-volatile memory device.

Memory 430 stores information and instructions to be executed by processor 410. In one embodiment, memory 430 may also store temporary variables or other intermediate information while processor 410 is executing instructions. In the illustrated embodiment, chipset 420 connects with processor 410 via Point-to-Point (PtP or P-P) interfaces 417 and 422. Chipset 420 enables processor 410 to connect to other elements in system 400. In some embodiments of the invention, interfaces 417 and 422 operate in accordance with a PtP communication protocol such as the Intel® QuickPath Interconnect (QPI) or the like. In other embodiments, a different interconnect may be used.

In some embodiments, chipset 420 is operable to communicate with processor 410, 405N, display device 440, and other devices 472, 476, 474, 460, 462, 464, 466, 477, etc. Chipset 420 may also be coupled to a wireless antenna 478 to communicate with any device configured to transmit and/or receive wireless signals.

Chipset 420 connects to display device 440 via interface 426. Display 440 may be, for example, a liquid crystal display (LCD), a plasma display, cathode ray tube (CRT) display, or any other form of visual display device. In some embodiments of the invention, processor 410 and chipset 420 are merged into a single SOC. In addition, chipset 420 connects to one or more buses 450 and 455 that interconnect various elements 474, 460, 462, 464, and 466. Buses 450 and 455 may be interconnected together via a bus bridge 472. In one embodiment, chipset 420 couples with a non-volatile memory 460, a mass storage device(s) 462, a keyboard/mouse 464, and a network interface 466 via interface 424 and/or 404, smart TV 476, consumer electronics 477, etc.

In one embodiment, mass storage device 462 includes, but is not limited to, a solid state drive, a hard disk drive, a universal serial bus flash memory drive, or any other form of computer data storage medium. In one embodiment, network interface 466 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although cache memory 416 is depicted as a separate block within processor 410, cache memory 416 (or selected aspects of 416) can be incorporated into processor core 412.

To better illustrate the methods and device disclosed herein, a non-limiting list of embodiments is provided here:

Example 1 includes an apparatus. The apparatus includes a socket connection that comprises a formed conductive member extending from a first contact at a first end to a first slot near a second end, wherein the first slot is configured to align with a first contact of a device, wherein the first formed conductive member has a flexible bend, and a formed shield member extending from a first ground plane at a first end to a second ground plane at a second end, wherein the formed shield member is adjacent to the formed conductive member along a first side to shield the first side of the formed conductive member from electromagnetic waves, wherein the formed shield member has a flexible bend.

Example 2 includes the apparatus of example 1, wherein a horizontal gap extending between the formed shield member and the first side of the formed conductive member is constant from the first end to the second end of the formed shield member.

Example 3 includes the apparatus of any one of examples 1-2, wherein the formed conductive member and the formed shield member are adapted to mechanically compress in a vertical direction when a device is installed on the socket connection.

Example 4 includes the apparatus of any one of examples 1-3, wherein the formed shield member is a first formed shield member, wherein the socket connection further comprises a second formed shield member extending from the first ground plane at a first end to the second ground plane at a second end, wherein the formed shield member is adjacent to the formed conductive member along a second side to shield the second side of the formed conductive member from electromagnetic waves, wherein the second formed shield member has a flexible bend.

Example 5 includes the apparatus of any one of examples 1-4, wherein a horizontal gap extending between the first formed shield member and the formed conductive member is equal to a horizontal gap extending between the second formed shield member and the formed conductive member.

Example 6 includes the apparatus of any one of examples 1-5, wherein the formed conductive member has a rectangular cross section.

Example 7 includes the apparatus of any one of examples 1-6, wherein the first shield member and the second shield member each have a rectangular cross section.

Example 8 includes the apparatus of any one of examples 1-7, wherein the formed conductive member is a first formed conductive member, wherein the socket connection further comprises a second formed conductive member extending from a second contact at a first end to a second slot near a second end, wherein the second slot is configured to align with a second contact of a device, wherein the second formed conductive member includes a flexible bend.

Example 9 includes the apparatus of any one of examples 1-8, wherein the socket connection further comprises, near the first end of the formed conductive member, a ball guide layer having slots that guide contacts of the device into place during installation, a conductive plate coupled to a ground node to form the first ground plane, wherein the formed shield member contacts the conductive plate, and a stiffener layer configured to provide structural support for the ball guide layer and the conductive plate.

Example 10 includes the apparatus of any one of examples 1-9, wherein the socket connection further comprises, near the second end of the formed conductive member, a conductive plate coupled to a ground node to form the second ground plane, wherein the formed shield member contacts the conductive plate, a printed circuit board to provide an interface between a tester and the formed conductive member for testing the device, a contact to electrically connect the formed conductive member and the printed circuit board, and a printed circuit board cap extending between the conductive plate and the printed circuit board to protect the printed circuit board.

Example 11 includes a socket connection that includes a formed conductive member having a shape to apply contact force while in operation, the formed conductive member extending from a first contact to a first slot, wherein the first slot is configured to align with a first contact of a device, and a formed shield member having a same shape as the formed conductive member and installed adjacent to a first side of the formed conductive member, the formed shield member extending from a first ground plane to a second ground plane.

Example 12 includes the socket connection of example 11, wherein the formed shield member is a first formed shield member, the socket connection further comprising a second formed shield member having the same shape as the formed conductive member and installed adjacent to a second side of the formed conductive member, the second formed shield member extending from the first ground plane to the second ground plane.

Example 13 includes the socket connection of any one of examples 11-12, wherein the formed conductive member has one of a C-shape or a J-shape.

Example 14 includes the socket connection of any one of examples 11-13, wherein the formed conductive member has a rectangular cross-section shape.

Example 15 includes the socket connection of any one of examples 11-14, wherein the socket connection further comprises a first layer configured to provide structural support, and a conductive layer formed over the first layer, the conductive layer coupled to a ground node to form the first ground plane, wherein the formed shield member contacts the conductive layer.

Example 16 includes the socket connection of any one of examples 11-15, wherein the socket connection further comprises a printed circuit board to provide an interface between a tester and the formed conductive member for testing the device, a printed circuit board cap formed over the printed circuit board to protect the printed circuit board, and a conductive layer formed over the printed circuit board cap, the conductive layer coupled to a ground node to form the second ground plane, wherein the formed shield member contacts the conductive layer.

Example 17 includes a method comprising inserting a formed conductive member between a first contact at a first end and a first slot near a second end, wherein the first slot is configured to align with a first contact of a device, wherein the first formed conductive member has a flexible bend, and inserting a formed shield member adjacent to a first side of the formed conductive member and between a first ground plane at a first end and a second ground plane at a second end, wherein the formed shield member has a flexible bend.

Example 18 includes the method of example 17, further comprising maintaining a constant horizontal gap between the formed shield member and the first side of the formed conductive member.

Example 19 includes the method of any one of examples 17-18, further comprising compressing the formed conductive member and the formed shield member to connect the device.

Example 20 includes the method of any one of examples 17-19, wherein the formed shield member is a first formed shield member, the method further comprising inserting a second formed shield member adjacent to a second side of the formed conductive member and between the first ground plane at a first end and the second ground plane at a second end, wherein the second formed shield member has a flexible bend.

Example 21 includes the method of any one of examples 17-20, wherein a horizontal gap extending between the first formed shield member and the formed conductive member is equal to a horizontal gap extending between the second formed shield member and the formed conductive member.

These examples are intended to provide non-limiting examples of the present subject matter—they are not intended to provide an exclusive or exhaustive explanation. The detailed description above is included to provide further information about the present devices, and methods.

The above detailed description includes references to the accompanying drawings, which form a part of the detailed description. The drawings show, by way of illustration, specific embodiments in which the disclosure can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the disclosure should be determined with reference to the appended claims, along with the full scope of equivalents to which such claims are entitled.

What is claimed is:

1. An apparatus, comprising:
   a socket connection comprising:
   a conductive member extending from a first contact at a first end to a first slot near a second end, wherein the first slot is configured to align with a contact of a device, wherein the first conductive member has a first bend;
   a shield member extending from a first ground plane at a first end to a second ground plane at a second end, wherein the shield member is adjacent to the conductive member along a first side to shield the first side of the conductive member from electromagnetic waves, wherein the shield member has a second bend; and
   wherein the first and second bends are configured to provide spring-like compliance in both a horizontal and vertical direction during a socket insertion.

2. The apparatus of claim 1, wherein a horizontal gap extending between the shield member and the first side of the conductive member is constant from the first end to the second end of the shield member.

3. The apparatus of claim 1, wherein the conductive member and the shield member are adapted to mechanically compress in a vertical direction when a device is installed on the socket connection.

4. The apparatus of claim 1, wherein the shield member is a first shield member, wherein the socket connection further comprises a second shield member extending from the first ground plane at a first end to the second ground plane at a second end, wherein the shield member is adjacent to the conductive member along a second side to shield the second side of the conductive member from electromagnetic waves, wherein the second shield member has a bend.

5. The apparatus of claim 4, wherein a horizontal gap extending between the first shield member and the conductive member is equal to a horizontal gap extending between the second shield member and the conductive member.

6. The apparatus of claim 4, wherein the conductive member has a rectangular cross section.

7. The apparatus of claim 6, wherein the first shield member and the second shield member each have a rectangular cross section.

8. The apparatus of claim 1, wherein the conductive member is one of a number of identical conductive members in an array.

9. The apparatus of claim 1, wherein the socket connection further comprises, near the first end of the conductive member:
- a ball guide layer having slots that guide contacts of the device into place during installation;
- a conductive plate coupled to a ground node to form the first ground plane, wherein the shield member contacts the conductive plate; and
- a stiffener layer configured to provide structural support for the ball guide layer and the conductive plate.

10. The apparatus of claim 1, wherein the socket connection further comprises, near the second end of the conductive member:
- a conductive plate coupled to a ground node to form the second ground plane, wherein the shield member contacts the conductive plate;
- a printed circuit board to provide an interface between a tester and the conductive member for testing the device;
- a contact to electrically connect the conductive member and the printed circuit board; and
- a printed circuit board cap extending between the conductive plate and the printed circuit board to protect the printed circuit board.

* * * * *